(12) United States Patent
Wang

(10) Patent No.: US 9,740,061 B2
(45) Date of Patent: Aug. 22, 2017

(54) ARRAY SUBSTRATE, LIQUID CRYSTAL PANEL AND DISPLAY DEVICE

(71) Applicant: BOE TECHNOLOGY GROUP CO., LTD., Beijing (CN)

(72) Inventor: Xiaolin Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 14/402,966

(22) PCT Filed: Dec. 5, 2013

(86) PCT No.: PCT/CN2013/088582
§ 371 (c)(1),
(2) Date: Nov. 21, 2014

(87) PCT Pub. No.: WO2015/043065
PCT Pub. Date: Apr. 2, 2015

(65) Prior Publication Data
US 2016/0266454 A1    Sep. 15, 2016

(30) Foreign Application Priority Data
Sep. 26, 2013  (CN) .......................... 2013 1 0446733

(51) Int. Cl.
*G02F 1/1337*  (2006.01)
*H01L 27/12*   (2006.01)
(Continued)

(52) U.S. Cl.
CPC ...... *G02F 1/134363* (2013.01); *G02F 1/1337* (2013.01); *G02F 1/1368* (2013.01);
(Continued)

(58) Field of Classification Search
CPC ............... H01L 27/124; H01L 27/1248; H01L 27/3241; H01L 27/3244; H01L 27/3248;
(Continued)

(56) References Cited

U.S. PATENT DOCUMENTS 6,506,617 B1  1/2003  Cheng
7,679,707 B2  3/2010  Tanaka
(Continued)

FOREIGN PATENT DOCUMENTS

CN    101625491 A    1/2010
CN    102629606 A    8/2012
(Continued)

OTHER PUBLICATIONS

International Search Report Appln. No. PCT/CN2013/088582; Dated Jun. 30, 2014.
(Continued)

*Primary Examiner* — Galina Yushina
(74) *Attorney, Agent, or Firm* — Ladas & Parry LLP

(57) ABSTRACT

An array substrate includes: a base substrate; a sub-pixel region on the base substrate in which a first electrode and a second electrode are provided, one of the first electrode and the second electrode being a common electrode, the other being a pixel electrode; an insulating layer between the first electrode and the second electrode; the sub-pixel region comprises right opposite overlapping regions between the first electrode and the second electrode that are disposed in different layers and non-right opposite overlapping regions; and hollowed-out regions are provided at least in regions of the insulating layer that correspond to the non-right opposite overlapping regions. The array substrate is used to provide a liquid crystal panel with low power dissipation.

19 Claims, 5 Drawing Sheets

(51) Int. Cl.
  *G02F 1/1343* (2006.01)
  *G02F 1/1362* (2006.01)
  *G02F 1/1368* (2006.01)
  *G02F 1/1333* (2006.01)
(52) U.S. Cl.
  CPC .... G02F 1/13439 (2013.01); G02F 1/134309 (2013.01); G02F 1/136286 (2013.01); H01L 27/124 (2013.01); H01L 27/1248 (2013.01); *G02F 1/133345* (2013.01); *G02F 2001/134345* (2013.01); *G02F 2001/134372* (2013.01)
(58) Field of Classification Search
  CPC ... G02F 1/134363; G02F 2001/134372; G02F 1/13439; G02F 1/136286; G02F 2001/134345; G02F 1/1343; G02F 1/13; G02F 2001/1635; G02F 2001/134318; G02F 1/133707
  See application file for complete search history.

(56) References Cited

U.S. PATENT DOCUMENTS

| | | | |
|---|---|---|---|
| 2002/0171779 A1 | 11/2002 | Kimura et al. | |
| 2007/0182899 A1* | 8/2007 | Tanaka | G02F 1/134363 349/122 |
| 2008/0018814 A1* | 1/2008 | Tsai | G02F 1/133707 349/37 |
| 2010/0007836 A1* | 1/2010 | Lee | G02F 1/134363 349/139 |
| 2010/0134744 A1* | 6/2010 | Lee | H01L 27/124 349/143 |
| 2012/0184060 A1* | 7/2012 | Song | H01L 27/1214 438/34 |
| 2013/0154912 A1* | 6/2013 | Nagami | G09G 3/3648 345/92 |
| 2014/0054617 A1 | 2/2014 | Li et al. | |

FOREIGN PATENT DOCUMENTS

| | | |
|---|---|---|
| CN | 203480177 U | 3/2014 |
| JP | 2010-230744 A | 10/2010 |
| WO | 0227392 A1 | 4/2002 |

OTHER PUBLICATIONS

International Preliminary Report on Patentability issued Mar. 29, 2016; PCT/CN2013/088582.

Third Chinese Office Action dated May 5, 2016; Appln. No. 201310446733.3.

Second Chinese Office Action dated Jan. 5, 2016; Appln. No. 201310446733.3.

First Chinese Office Action Appln. No. 201310446733.3; Dated Jul. 27, 2015.

* cited by examiner

ARRAY SUBSTRATE, LIQUID CRYSTAL PANEL AND DISPLAY DEVICE

TECHNICAL FIELD

Embodiments of the present invention relate to an array substrate, a liquid crystal panel and a display device.

BACKGROUND

Thin film transistor liquid crystal displays (TFT-LCDs) play a dominant role in the current flat display market due to their features such as small volume, low power consumption, no irradiation and so on.

Liquid crystal displays may be classified in terms of display modes into Twisted Nematic (TN) type, In Plane Switching (IPS) type, Advanced Super Dimension Switch (ADS) type and so on. In an ADS mode liquid crystal display, a multi-dimensional electric field is formed with both an electric field produced at edges of slit electrodes on the same plane and an electric field produced between a slit electrode layer and a planar electrode layer in the liquid crystal display, which is mainly a horizontal electric field so that liquid crystal molecules at all orientations, which are located between the slit electrodes and directly above the slit electrodes in a liquid crystal cell, can be rotated, which enhances the work efficiency of the liquid crystal and increases light transmittance. The Advanced-Super Dimensional Switching technology can improve the picture quality of TFT-LCDs and has advantages of high transmissivity, wide viewing angles, high aperture ratio, low chromatic aberration, low response time, no push Mura, etc.

For different applications, improved technologies of ADS include high transmittance I-ADS technology, high aperture ratio H-ADS. high resolution S-ADS technology, etc.

In the pixels of an ADS mode liquid crystal display, the pixel electrode and the common electrode are located in different layers and insulated via an insulating layer with a multi-dimensional electric field to be formed between the pixel electrode and the common electrode. Electric field lines pass through the insulating layer that attenuates the strength of electric field to a certain degree such that the strength of electric field actually applied upon liquid crystal molecules is smaller than the strength of electric field corresponding to the driving voltage applied between the pixel electrode and the common electrode, thereby liquid crystal molecules may not rotate, or may not rotate in an ideal way. Thus, in order for liquid crystal molecules to achieve ideal rotation status, it is required to apply a larger driving voltage between the pixel electrode and the common electrode. Therefore, the liquid crystal panels with an existing structure have high power consumption.

SUMMARY

Embodiments of the present invention disclose an array substrate, a liquid crystal panel and a display device for providing a liquid crystal panel with low power dissipation.

An embodiment of the present invention provides an array substrate including: a base substrate; a sub-pixel region on the base substrate in which a first electrode and a second electrode are provided, one of the first electrode and the second electrode being a common electrode, the other being a pixel electrode; an insulating layer between the first electrode and the second electrode; the sub-pixel region comprises right opposite overlapping regions between the first electrode and the second electrode that are disposed in different layers and non-right opposite overlapping regions; and hollowed-out regions are provided at least in regions of the insulating layer that correspond to the non-right opposite overlapping regions.

For example, the second electrode is located on the base substrate, the insulating layer is located on the second electrode, the first electrode is located on the insulating layer; the first electrode is a slit-like electrode, and the second electrode is a plate electrode or a slit-like electrode.

For example, the first electrode is a slit-like electrode, the second electrode is a plate electrode, and hollowed-out regions are provided in regions in the insulating layer that correspond to slits of the slit-like first electrode. For example, a projection of the hollowed-out regions on the base substrate coincides with a projection of slits of the slit-like first electrode on the base substrate.

Preferably, the first electrode is a slit-like electrode, the second electrode is a slit-like electrode, and hollowed-out regions are provided in regions in the insulating layer that correspond to slits of the first electrode and slits of the second electrode. For example, slit-like first electrode and slit-like second electrode overlap each other with a shift therebetween, and the slit-like first electrode and the slit-like second electrode are exposed on at least one side.

For example, the array substrate may further include gate lines and data lines, the insulating layer is further located between the gate lines and the data lines and in regions corresponding to regions where the gate lines and the data lines overlap right oppositely, and no insulating layer is provided in regions between the gate lines and the first electrode and the second electrode; and/or no insulating layer is provided in regions between the data lines and the first electrode and the second electrode.

For example, the array substrate may further include a thin film transistor in the sub-pixel region and connected with the pixel electrode, the insulating layer being a single insulating layer and in a same layer as a passivation layer or a gate insulating layer of the thin film transistor.

For example, the array substrate may further include a thin film transistor in the sub-pixel region and connected with the pixel electrode, the insulating layer being a double-layered insulating layer, one of two sub-layers being in the same layer as the passivation layer of the thin film transistor and the other being in a same layer as the gate insulating layer of the thin film transistor.

Another embodiment of the present invention provides a liquid crystal panel including the above-mentioned array substrate.

Yet another embodiment of the present invention provides a display device including the above-mentioned liquid crystal panel.

In summary, embodiments of the present invention provide an array substrate that reduces driving voltages for driving liquid crystal molecules to work normally and reduces power consumption of the liquid crystal panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiments of the present invention disclose an array substrate, a liquid crystal panel and a display device for providing a liquid crystal panel with low power dissipation.

Embodiments of the present invention are based on a liquid crystal panel with wide viewing angle and high transmittance, more particularly, based on a liquid crystal panel in which pixel electrodes and common electrodes are both located on different layers on the array substrate and insulated via an insulating layer. For example, the pixel electrodes and/or common electrodes are slit-like electrodes with strip electrodes disposed between adjacent slits. By providing hollowed-out regions at least in regions corresponding to slits between the two adjacent strip electrodes on the insulating layer, attenuation of strength of electric field between common electrodes and pixel electrodes by the insulating layer is reduced, thereby realizing a liquid crystal panel with low power dissipation.

A liquid crystal panel generally includes a pixel array comprising a plurality of pixels each including a plurality of sub-pixels such as red, green or blue sub-pixels. Embodiments of the present invention will be explained with diagram showing a local structure of an array substrate corresponding to one sub-pixel (such as a red, green or blue sub-pixel region) in a liquid crystal panel as an example.

Figure 1:
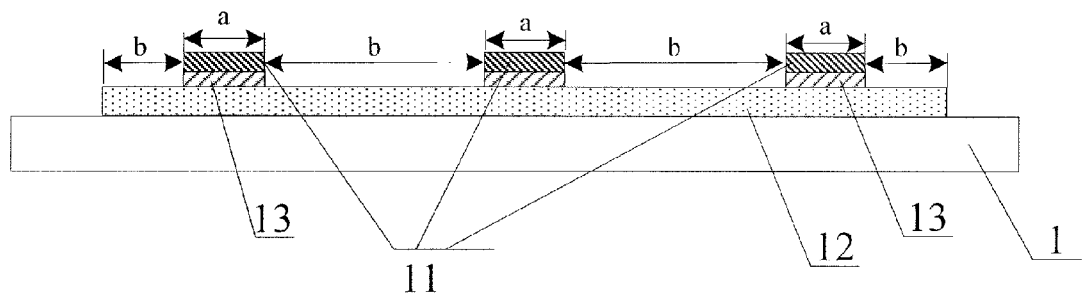
FIG. 1 is a schematic cross-sectional view of an array substrate provided in an embodiment of the present invention.

FIG. 1 is a schematic cross-sectional view of an array substrate provided in an embodiment of the present invention. As shown in FIG. 1, the array substrate includes: a base substrate 1; a sub-pixel region on the base substrate 1 in which a first electrode 11 and a second electrode 12 are provided; and an insulating layer 13 between the first electrode 11 and the second electrode 12; one of the first electrode 11 and the second electrode 12 is a common electrode, while the other is a pixel electrode; and the sub-pixel region includes right opposite overlapping regions "a" between the first electrode 11 and the second electrode 12 in different layers and non-right opposite overlapping regions "b". Hollowed-out regions are provided in the insulating layer 13 at least in regions corresponding to the non-right opposite overlapping regions "b" to expose at least one side of the first electrode 11.

The hollowed-out regions may have certain patterns. For example, all the regions of the insulating layer that correspond to the non-right opposite overlapping regions "b" are hollowed-out regions, that is, insulating layer is not disposed in all regions corresponding to the non-right opposite overlapping regions "b." Alternatively, hollowed-out regions are provided in some regions corresponding to the non-right opposite overlapping regions "b", while the insulating layer is remained in the remaining regions.

Figure 2:
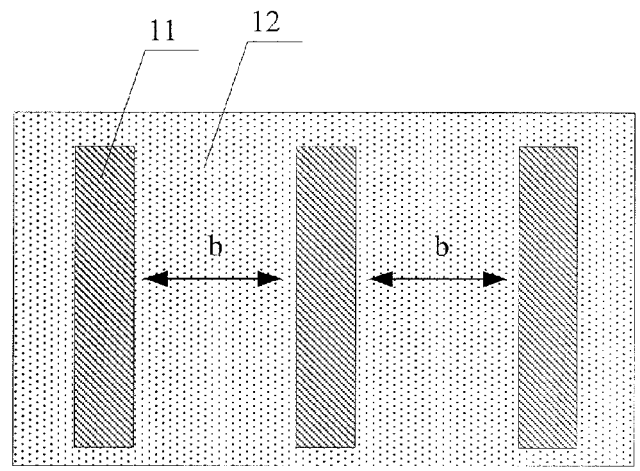
FIG. 2 is a first schematic view of the array substrate shown in FIG. 1.

FIG. 2 is a top schematic view of the array substrate shown in FIG. 1. FIG. 2 shows that hollowed-out regions are provided in all regions of the insulating layer that correspond to the non-right opposite overlapping regions "b." That is, the projected area of hollowed-out regions on the first substrate is equal to the projected area of non-right opposite overlapping regions "b" between the first electrode and the second electrode on the base substrate.

Figure 3:
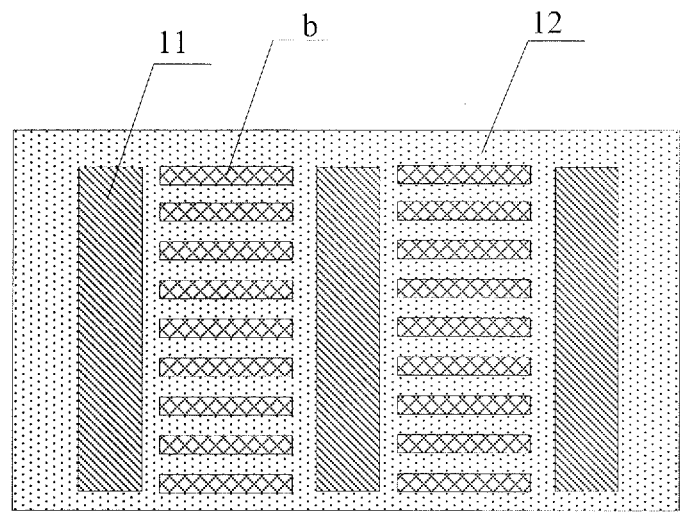
FIG. 3 is a second schematic view of the array substrate shown in FIG. 1.

FIG. 3 shows that hollowed-out regions are provided in some regions of the insulating layer that correspond to the non-right opposite overlapping regions "b," which may have circle, ellipse, polygon and slit patterns. Hollowed-out regions "b" shown in FIG. 3 are slit-like. The projected area of hollowed-out regions on the first substrate is smaller than the projected area of non-right opposite overlapping regions "b" between the first electrode and the second electrode on the base substrate.

Figure 4:
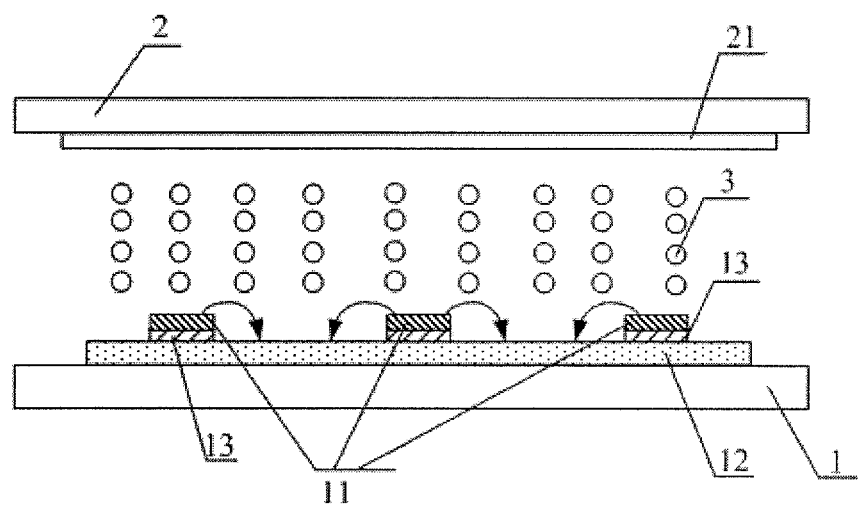
FIG. 4 is a structure view of a liquid crystal panel provided in an embodiment of the present invention.

Referring to FIG. 4, when a voltage is applied between the first electrode and the second electrode, for example, when a data line voltage VData is applied to the first electrode and a common voltage Vcom is applied to the second electrode, an electric field if formed between them. The electric field acts on liquid crystal molecules between the array substrate and the color filter substrate to make liquid crystal molecules rotate to a certain degree for display.

Description is given below with a liquid crystal panel including a color filter substrate and an array substrate as an example. As shown in FIG. 4, the liquid crystal panel includes a first base substrate 1 and a second substrate 2 disposed opposite to the first base substrate 1, and further includes a liquid crystal layer 3 between the first base substrate 1 and the second substrate 2, with a color resin layer 21 disposed on one side of the second substrate 2 that is close to the liquid crystal layer 3. Here, the first base substrate 1 is an array substrate while the second substrate 2 is a color filter substrate. The color resin layer in the drawing is only for illustrative purpose rather than representing actual arrangement of the color resin layer. Furthermore, the color filter substrate includes not only the color resin layer but also may include the black matrix and other layers.

Arrow headed line segments as shown in FIG. 4 are electric field lines. The insulating layer 13 is only located in right opposite overlapping regions between the first electrode 11 and the second electrode 12, no insulating layer 13 is disposed in the non-right opposite overlapping regions between the first electrode 11 and the second electrode 12. When the electric field passes through the non-right opposite overlapping regions between the first electrode 11 and the second electrode 12, it does not pass the insulating layer 13, reducing attenuation of the strength of electric field by the insulating layer 13, and thereby realizing a liquid crystal panel with low power dissipation.

One preferable example of the above-mentioned array substrate is as follows. Referring to FIG. 1 the second electrode 12 is located on the base substrate 1, the insulating layer 13 is located on the second electrode 12, the first electrode 11 is located on the insulating layer 13; the first electrode 11 is a slit-like electrode and the second electrode 12 is a plate electrode.

Of course, embodiments of the present invention are not limited to the case that the first electrode is a plate electrode and the second electrode is a slit-like electrode.

When the first electrode and the second electrode have slits therein, the first electrode and the second electrode may be provided with or without right opposite overlapping regions therebetween.

The above-mentioned preferable embodiments will be described in detail below with reference to accompanying drawings.

Referring to FIG. 1, in one example, the first electrode 11 is a slit-like electrode, and accordingly the first electrode 11 comprises a plurality of strip electrodes that can be electrically connected to each other via connecting electrodes (not shown). The second electrode 12 is a plate electrode, i.e., a planar electrode without any pattern. Hollowed-out regions are provided in regions on the insulating layer 13 that correspond to slits of the slit-like first electrode 11. Preferably, projection of hollowed-out regions "b" on the base substrate 1 coincides with the projection of slits of the slit-like first electrode 11 on the base substrate 1.

Figure 5:
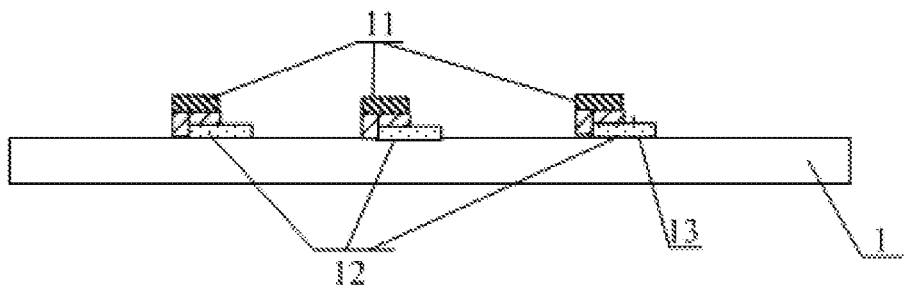
FIG. 5 is a schematic cross-sectional view of another array substrate provided in an embodiment of the present invention.

Referring to FIG. 5, in another example, the first electrode 11 is a slit-like electrode and comprises a plurality of strip electrodes that can be electrically connected to each other via connecting electrodes (not shown). The second electrode 12 is a slit-like electrode and comprises a plurality of strip electrode that can be electrically connected to each other via connecting electrodes (not shown). Hollowed-out regions are provided in regions on the insulating layer 13 that correspond to slits of the first electrode 11 and slits of the second electrode 12. Preferably, projection of hollowed-out regions on the base substrate 1 coincides with the projection of slits of the slit-like first electrode 11 and the slit-like second electrode 12 on the base substrate 1.

Preferably, as shown in FIG. 5, the insulating layer between the slit-like first electrode 11 and the slit-like second electrode 12 overlap these electrodes partially, and the slit-like first electrode 11 and the slit-like second electrode 12 overlap with a shift therebetween (i.e., not immediately opposite to each other), that is, the insulating layer is arranged such that slit-like first electrode 11 and slit-like second electrode are exposed at least on one side. Thus, slit-like first electrode 11 and slit-like second electrode 12 exposed at the same side do not pass the insulating layer 13, thereby reducing attenuation of the strength of electric field by the insulating layer 13 and realizing a liquid crystal panel with low power dissipation.

The array substrate shown in FIGS. 1 and 5 is applicable to liquid crystal panels of advanced super dimension switch (ADS) mode or their variants that can form a multi-dimensional electric field between first electrodes and second electrodes, which can increase work efficiency of liquid crystal and enhance light transmission efficiency.

Figure 6:
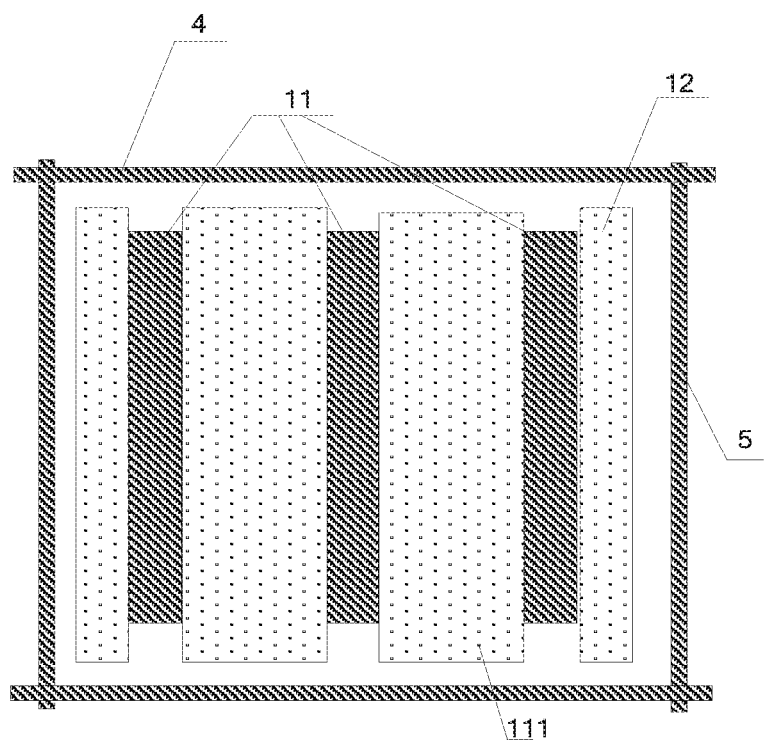
FIG. 6 is a third top schematic view of the array substrate structure shown in FIG. 1.
Figure 6A:
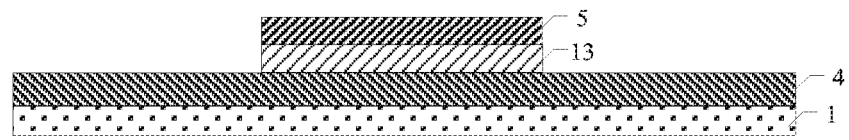
FIG. 6a is a schematic cross-sectional view of another array substrate provided in an embodiment of the present invention.

Furthermore, FIG. 6a is a schematic cross-sectional view of another array substrate provided in an embodiment of the present invention. As illustrated in FIG. 6a, the array substrate may further include gate lines 4 and data lines 5. Preferably, the insulating layer 13 is further located between the gate lines 4 and data lines 5 and in regions corresponding to the positions where the gate lines 4 and data lines 5 overlap right opposite to each other, no insulating layer or partial insulating layer is disposed within regions between gate lines and first electrodes and second electrodes; and/or, no insulating layer or partial insulating layer is disposed within regions between data lines and first electrodes and second electrodes.

Referring to FIG. 6, which is a top view of the array substrate provided in an embodiment of the present invention, the array substrate includes a plurality of gate lines 4 and a plurality of data lines 5 crossing each other on the first substrate (not shown in FIG. 6). One sub-pixel region is defined by adjacent two gate lines 4 and adjacent two data lines 5. Hereinafter, explanation will be given with the first electrode being a pixel electrode and the second electrode being a common electrode as an example. It is to be noted that thin film transistors are not shown in the diagram of sub-pixel regions for the convenience of understanding. Each sub-pixel region includes a pixel electrode 11 and a common electrode 12.

In order to further reduce attenuation of the strength of electric field by the insulating layer, referring to FIG. 6, no insulating layer, is provided in regions between the gate lines 4 and the pixel electrode 11 and the common electrode 12, that is, hollowed-out regions are also provided; and no insulating layer is provided in regions between the data lines 5 and the pixel electrode 11 and the common electrode 12, that is, hollowed-out regions are also provided.

In a similar way, hollowed-out regions between data lines and strip electrodes may have certain patterns, that is, the projected area of hollowed-out regions on the first substrate is smaller than the projected area of slits between the data lines and the strip electrodes on the first substrate. Alternatively, hollowed-out regions between the data lines and the strip electrodes are hollowed-out regions that have the size and the shape consistent with slits between data lines and strip electrodes, that is, the projected area of hollowed-out regions between the data lines and the strip electrodes on the first substrate is equal to the projected area of slits between the data lines and the strip electrodes on the first substrate and their projections coincide with each other.

The first electrode 11 shown in FIG. 6 includes a plurality of strip electrodes 111 disposed in a direction in which the data lines 5 extend and a plurality of strip electrodes 111 in the sub-pixel region are electrically connected to each other via connecting electrodes. Alternatively, for example, the strip electrodes 111 may also be disposed in a direction in which the gate lines 4 extend.

Figure 7A:
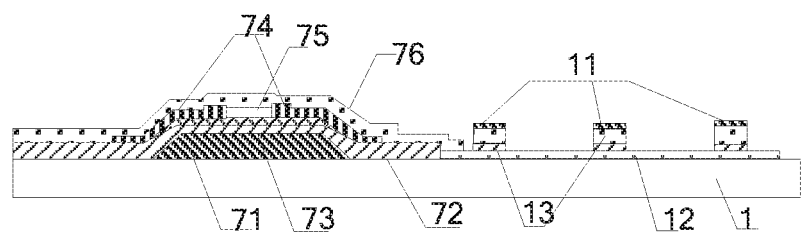
FIG. 7a is a schematic cross-sectional view of another array substrate including thin film transistors provided in an embodiment of the present invention.
Figure 7:
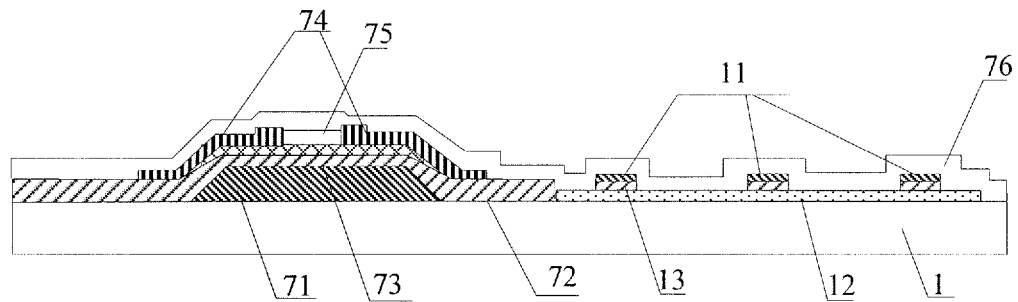
FIG. 7 is a schematic cross-sectional view of an array substrate including thin film transistors provided in an embodiment of the present invention.

Preferably, with reference to FIG. 7, the sub-pixel region is further provided with a thin film transistor connected with the pixel electrode, which includes a gate electrode 71, a gate insulating layer 72, an active layer 73, source-drain electrodes 74, an etching stop layer 75 (optional, the etching stop layer may be provided for metal oxide thin film transistor), and a passivation layer 76.

The insulating layer is a single layer insulating layer, and the insulating layer is in the same layer as the passivation layer, or in the same layer as the gate insulating layer, or may also in the same layer as the etching stop layer (if any), etc.

In the example of the array substrate shown in FIG. 7, the insulating layer 13 is in the same layer as the gate insulating layer 72. In manufacturing the gate insulating layer of the thin film transistor, the insulating layer within the right opposite overlapping regions between the first electrode 11 and the second electrode 12 is remained while the insulating layer in other regions in the sub-pixel region is removed at the same time.

Preferably, FIG. 7a is a schematic cross-sectional view of another array substrate in an embodiment of the present invention. With reference to FIG. 7a, the insulating layer 13 is a double-layered insulating layer, one of the two sub-layers is in the same layer as the passivation layer 76 of the thin film transistor and the other is in the same layer as the gate insulating layer 72 of the thin film transistor.

The slit-like first electrode and the slit-like second electrode each include a plurality of strip electrodes.

Preferably, strip electrodes of the first electrode and strip electrodes of the second electrodes are linear electrodes. For example, as shown in FIG. 6, strip electrodes 111 of the first electrode 11 are linear electrodes. A pixel electrode or a common electrode comprising linear strip electrodes allow liquid crystal molecules to exhibit single-domain alignment.

Preferably, middle regions of strip electrodes of the first electrode or the second electrode have bending points at which strip electrodes are bent toward a same direction such that two end points and the bending points of strip electrodes constitute isosceles triangles with the bending point as vertices. The pixel electrode or the common electrode comprising strip electrodes with bending points allow liquid crystal molecules to exhibit dual-domain alignment. Such arrangement can increase the viewing angle of the liquid crystal panel and improve display quality of images.

Figure 8:
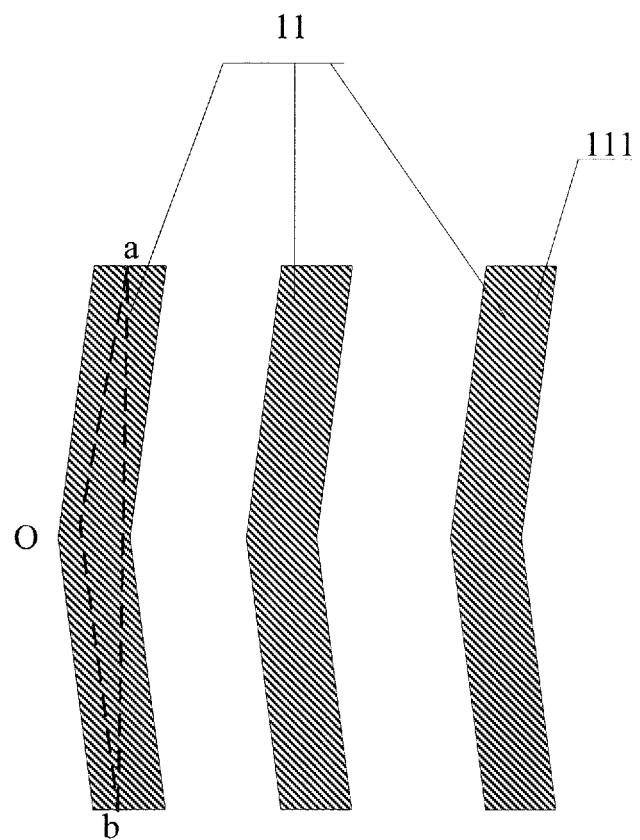
FIG. 8 is a structure view of one of the slit-like first electrode or second electrode provided in an embodiment of the present invention.

Taking the first electrode as an example, as shown in FIG. 8, the first electrode 11 includes a plurality of strip electrodes 111 aligned in a same direction with the middle region of every strip electrode 111 bending towards a first direction, such that two ends of the strip electrode 111 (end "a" and end "b" in FIG. 8) and the bending point (point "o" in FIG. 8) constitute one isosceles triangle with the bending point as apex (as shown in FIG. 8 by the isosceles triangle consisting of the closed broken lines).

Preferably, strip electrodes of the first electrode and the second electrode are in a shape of angular bracket "<" or ">" or round bracket "(" or ")."

The insulating layer provided in embodiments of the present invention may be a single insulating layer manufactured separately or comprise one or more insulating layers in right opposite overlapping regions between common electrodes and pixel electrodes remained while manufacturing the one or more insulating layers in thin film transistors, with insulating layers in other regions being removed.

Figure 9:
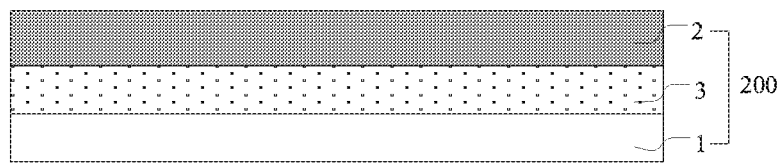
FIG. 9 is a structure view of another liquid crystal panel provided in an embodiment of the present invention.

Embodiments of the present invention further provide a liquid crystal panel including the array substrate of any of the above-mentioned modes. FIG. 9 is a structure view of another liquid crystal panel provided in an embodiment of the present invention. The liquid crystal display panel may further include a color filter substrate disposed opposite to the array substrate. Alternatively, the liquid crystal display panel may include a color filter layer disposed on the array substrate, while the opposed substrate disposed oppositely to the array substrate requires no color filter layer any more. The provision of the color filter layer is not limited as long as the liquid crystal display panel of embodiments of the present invention includes the array substrate provided in the above-mentioned embodiments.

Figure 10:
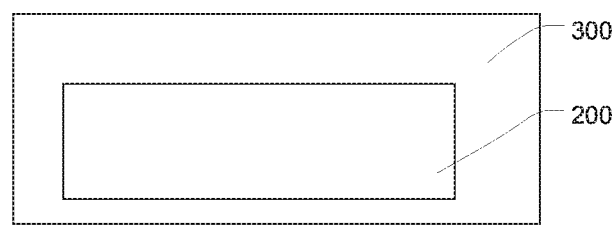
FIG. 10 is a schematic view of a display device provided in an embodiment of the present invention.

An embodiment of the present invention further provides a display device including the above-mentioned liquid crystal panel, which may be a liquid crystal panel, a liquid crystal display or a liquid crystal TV. FIG. 10 is a schematic view of a display device provided in an embodiment of the present invention.

In summary, the liquid crystal panel provided in an embodiment of the present invention includes: a pixel array located on a first substrate; first electrodes comprising one or more strip electrodes extending in a first direction disposed in the sub-pixel regions in the pixel array; and planar second electrodes disposed under and insulated with the first electrodes via an insulating layer; hollowed-out regions are formed in the insulating layer at least in regions corresponding to slits between the two adjacent strip electrodes. Voltages are applied between the first electrodes and the second electrodes to form electric fields between the first electrodes and the second electrodes, and electric field lines of the electric fields pass regions between adjacent two strip electrodes. Since regions of the insulating layer that correspond to slits between adjacent two strip electrodes are hollowed-out regions, electric field lines are not influenced by the insulating layer while passing through these regions, thereby avoiding electric field attenuation due to the presence of insulating layer in regions corresponding to slits between adjacent two strip electrodes, reducing the driving voltages for driving liquid crystal molecules to work normally and reducing power consumption of the liquid crystal panel.

What are described above is related to the illustrative embodiments of the disclosure only and not limitative to the scope of the disclosure; the scopes of the disclosure are defined by the accompanying claims.

The invention claimed is:

1. An array substrate comprising:
a base substrate;
gate lines and data lines disposed on the base substrate;
a sub-pixel region on the base substrate in which a first electrode and a second electrode are provided, one of the first electrode and the second electrode being a common electrode, the other being a pixel electrode;
an insulating layer between the first electrode and the second electrode;
wherein the sub-pixel region comprises right opposite overlapping regions between the first electrode and the second electrode that are disposed in different layers and non-right opposite overlapping regions; and hollowed-out regions are provided at least in regions of the insulating layer that correspond to the non-right opposite overlapping regions; the insulating layer is further located between the gate lines and the data lines and in regions corresponding to regions where the gate lines and the data lines overlap right oppositely, and no insulating layer is provided in regions between the gate lines and the first electrode and the second electrode; and/or no insulating layer is provided in regions between the data lines and the first electrode and the second electrode.

2. The array substrate of claim 1, wherein the second electrode is located on the base substrate, the insulating layer is located on the second electrode, the first electrode is located on the insulating layer; the first electrode is a slit-like electrode, and the second electrode is a plate electrode or a slit-like electrode.

3. The array substrate of claim 2, wherein the first electrode is a slit-like electrode, the second electrode is a plate electrode, and hollowed-out regions are provided in regions in the insulating layer that correspond to slits of the slit-like first electrode.

4. The array substrate of claim 3, wherein a projection of the hollowed-out regions on the base substrate coincides with a projection of slits of the slit-like first electrode on the base substrate.

5. The array substrate of claim 2, wherein the first electrode is a slit-like electrode, the second electrode is a slit-like electrode, and hollowed-out regions are provided in regions in the insulating layer that correspond to slits of the first electrode and slits of the second electrode.

6. The array substrate of claim 5, wherein slit-like first electrode and slit-like second electrode overlap each other with a shift therebetween, and the slit-like first electrode and the slit-like second electrode are exposed on at least one side.

7. The array substrate of claim 1, further comprising a thin film transistor in the sub-pixel region and connected with the pixel electrode, the insulating layer being a single insulating layer and in a same layer as a passivation layer or a gate insulating layer of the thin film transistor.

8. The array substrate of claim 1, further comprising a thin film transistor in the sub-pixel region and connected with the pixel electrode, the insulating layer being a double-layered insulating layer, one of two sub-layers being in the same layer as the passivation layer of the thin film transistor and the other being in a same layer as the gate insulating layer of the thin film transistor.

9. A liquid crystal panel comprising an array substrate according to claim 1.

10. A display device comprising a liquid crystal panel according to claim 9.

11. The array substrate of claim 1, wherein the second electrode is located on the base substrate, the insulating layer is located on the second electrode, the first electrode is located on the insulating layer; the first electrode is a slit-like electrode, and the second electrode is a plate electrode or a slit-like electrode.

12. The array substrate of claim 11, wherein the first electrode is a slit-like electrode, the second electrode is a plate electrode, and hollowed-out regions are provided in regions in the insulating layer that correspond to slits of the slit-like first electrode.

13. The array substrate of claim 12, wherein a projection of the hollowed-out regions on the base substrate coincides with a projection of slits of the slit-like first electrode on the base substrate.

14. The array substrate of claim 11, wherein the first electrode is a slit-like electrode, the second electrode is a slit-like electrode, and hollowed-out regions are provided in regions in the insulating layer that correspond to slits of the first electrode and slits of the second electrode.

15. The array substrate of claim 14, wherein slit-like first electrode and slit-like second electrode overlap each other with a shift therebetween, and the slit-like first electrode and the slit-like second electrode are exposed on at least one side.

16. The array substrate of claim 7, wherein the second electrode is located on the base substrate, the insulating layer is located on the second electrode, the first electrode is located on the insulating layer; the first electrode is a slit-like electrode, and the second electrode is a plate electrode or a slit-like electrode.

17. The array substrate of claim 16, wherein the first electrode is a slit-like electrode, the second electrode is a plate electrode, and hollowed-out regions are provided in regions in the insulating layer that correspond to slits of the slit-like first electrode.

18. The array substrate of claim 17, wherein a projection of the hollowed-out regions on the base substrate coincides with a projection of slits of the slit-like first electrode on the base substrate.

19. The array substrate of claim 18, wherein the first electrode is a slit-like electrode, the second electrode is a slit-like electrode, and hollowed-out regions are provided in regions in the insulating layer that correspond to slits of the first electrode and slits of the second electrode.

* * * * *